United States Patent [19]
Nii

[11] Patent Number: 5,350,699
[45] Date of Patent: Sep. 27, 1994

[54] METHOD OF MANUFACTURING A HETERO-JUNCTION BI-POLAR TRANSISTOR

[75] Inventor: Keita Nii, Kyoto, Japan

[73] Assignee: Rohm Co., Ltd., Kyoto, Japan

[21] Appl. No.: 59,268

[22] Filed: May 11, 1993

Related U.S. Application Data

[62] Division of Ser. No. 883,119, May 14, 1992 abandoned.

[30] Foreign Application Priority Data

Jul. 19, 1991 [JP] Japan .................. 3-179357

[51] Int. Cl.⁵ .......................... H01L 21/265
[52] U.S. Cl. .................. 437/31; 437/126; 437/133; 437/100; 148/DIG. 148
[58] Field of Search .............. 357/34, 45, 67; 437/100, 103, 126, 31, 133, 31, 100; 148/DIG. 148

[56] References Cited

U.S. PATENT DOCUMENTS

| | | | |
|---|---|---|---|
| 3,242,018 | 3/1966 | Grabmaier et al. | 257/197 |
| 3,634,149 | 1/1972 | Knippenberg et al. | 257/200 |
| 3,869,322 | 3/1975 | Cuomo et al. | 257/200 |
| 4,762,806 | 8/1988 | Suzuki et al. | 437/100 |
| 4,855,254 | 8/1989 | Eshita et al. | 148/DIG. 148 |
| 4,912,063 | 3/1990 | Davis et al. | 437/100 |
| 4,945,394 | 7/1990 | Palmour et al. | 357/34 |
| 5,190,890 | 3/1993 | Precht et al. | 437/100 |
| 5,200,022 | 4/1993 | Kong et al. | 437/100 |

FOREIGN PATENT DOCUMENTS 0145992 8/1985 Japan .................... 357/34

*Primary Examiner*—Tom Thomas
*Assistant Examiner*—Tuan Nguyen
*Attorney, Agent, or Firm*—Wenderoth, Lind & Ponack

[57] ABSTRACT

A hetero-junction bi-polar transistor provided with a collector composed of a $\beta$ - SiC substrate and a base area composed of a $\beta$ - SiC layer and an emitter area composed of an $\alpha$ - SiC layer, thereby forming a hetero-junction bi-polar transistor having superior heat resistance.

12 Claims, 1 Drawing Sheet

METHOD OF MANUFACTURING A HETERO-JUNCTION BI-POLAR TRANSISTOR

This application is a Division of now abandoned application Ser. No 07/883,119, filed on May 4, 1992.

BACKGROUND OF THE INVENTION

The present invention generally relates to a silicon carbide hetero-junction bi-polar transistor having an improved resistance to heat.

Generally, a hetero-Junction bi-polar transistor (hereinafter referred to as HBT) can increase the amplification factor and operation speed of a transistor, because the prohibition band width of an emitter area is made larger than the prohibition band width of a base area so as to prevent a carrier from being injected to the emitter from the base, and simultaneously, the doping concentration of the base can be made higher to reduce the base resistance. Studies of HBTs the GaAs - GaAlAs system were effected. In recent years, studies of HBTs of the Si system have actively been effected.

But the conventional HBT is inferior in resistance to heat since GaAs or, Si were used in the basic plate, with a defect in that the locations for the use thereof were restricted to 300° C. or lower.

SUMMARY OF THE INVENTION

Accordingly, the present invention has been developed with a view to substantially eliminating the above discussed drawbacks inherent in the prior art, and has for its essential object to provide an improved HBT.

Another important object of the present invention is to provide an improved HBT which has superior heat resistance.

In accomplishing these an other objects, according to one preferred embodiment of the present invention, a HBT is newly created, which is provided with a base area composed of a $\beta$ - SiC layer and an emitter area composed of an $\alpha$ - SiC layer.

The HBT of the present invention composed of the above described construction uses a $\beta$ - SiC with a 2.2 eV band gap, and uses an $\alpha$ - SiC with a 2.86 through 3.30 eV band gap which is larger than that of Si or GaAs. Since the $\alpha$ - SiC and the $\beta$ - SiC are chemically stable materials, the HBT made with the combination of the $\beta$ - SiC and the $\alpha$ - SiC is capable of operations at high temperatures (approximately 600° C. or more) and have superior heat resistance. Since the SiC has a large resistance to puncture by an electric field, a transistor made with SiC can operate at a high power. Further, there is an advantage in that a larger current amplification factor and higher speed operation can be realized using of the hetero-junction characteristics.

Therefore, the HBT of the present invention is superior and can be used as a transistor for control use of power engine portions, atomic furnaces, artificial satellites or high-frequency power transistors.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
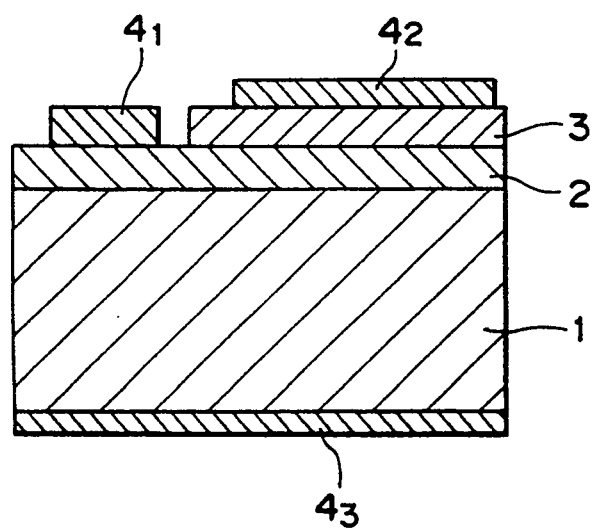
FIG. 1 is a sectional view showing the construction in accordance with one embodiment of a hetero-sealing bi-polar transistor of the present invention.

Before the description of the present invention proceeds, it is to be noted that like parts are designated by like reference numerals throughout the accompanying drawings.

Generally, SiC includes an $\alpha$ - SiC having a six sided crystal arrangement or the like and a $\beta$ - SiC of cubic crystal arrangement of its atoms. One type of 3C -SiC only exists as a cubic crystal, and crystal polymorphs such as 6H - SiC, 4H - SiC, 15R - SiC or the like exist in the six sided crystal arrangement or the like. FIG. 1 shows an HBT composed of a $\beta$ - SiC and the $\alpha$ - SiC (6H) fabricated by the following four steps.

1) $B^+$ is injected by ion inplantation onto the top face (1, 0, 0) of a N type $\beta$ - SiC basic plate 1 so as to form a P type $\beta$ - SiC layer 2. The P type $\beta$ - SiC layer 2 forms a base area.

2) Then, a phosphorus doped $\alpha$ - SiC (6H) layer 3 is grown to approximately 0.2 μm on the above described P type $\beta$ - SiC layer 2 by an RF - CVD method. The conditions of the RF - CVD method are 1200° C. in basic plate temperature, $SiH_4$ (0.15 sccm)+$C_3H_8$ (0.2 sccm) in reaction gas composition. The $\alpha$ - SiC (6H) layer 3 forms an emitter area.

3) Further, the $\alpha$ - SiC layer 3 is selectively etched by a plasma etching operation so as to externally expose a partial portion surface of the p type $\beta$ - SiC layer 2. The plasma etching conditions are 200 W in RFPower, 0.005 Torr in pressure, $O_2$ (50%)+$CF_4$ (50%) in reaction gas composition.

4) Finally, after the evaporating operation of the Mo electrode on the reverse face and the surface of the basic plate, an partial etching operation is effected so as to form an ohmic electrode. Therefore, the ohmic electrode 4 is formed ($4_1$, $4_2$) on the base area 2 and the emitter area 3, and also, is formed on the under face of the N type $\beta$ - SiC basic plate 1 so as to form a ($4_3$) collector electrode.

Through such steps as described hereinabove, a HBT having a base area composed of the $\beta$ - SiC layer and an emitter area composed of the $\alpha$ - SiC layer can be obtained.

As is clear from the foregoing description, according to the arrangement of the present invention, the HBT obtained as described hereinabove is made with the $\beta$ - SiC and the $\alpha$ - SiC being combined. The HBT composed of the above described construction uses a $\beta$ - SiC having a 2.2 eV band gap, and uses an $\alpha$ - SiC having a 2.86 through 3.30 eV band gap, which is larger than that of Si or GaAs. Since the $\alpha$ - SiC and the $\beta$ - SiC are chemically stable materials, the HBT is capable of operations at high temperatures and are superior. Since the SiC has a large resistance to puncture by an electric field, a transistor made with Sic can operate at a high power. Further, there is an advantage in that a larger current amplification factor and a higher speed operation can be realized using the hetero-sealing characteristics.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing a hetero-junction bipolar transistor comprising the steps of:
   A) forming a beta silicon carbide layer of a first type of conductivity on a top face of a beta silicon carbide substrate of a second type of conductivity which is opposite of that of the first type of conductivity, the beta silicon carbide layer of the first type of conductivity forming a base area of the transistor and the beta silicon carbide substrate of the second type of conductivity forming the collector of the transistor;
   B) forming an alpha silicon carbide layer of the second type of conductivity on the beta silicon carbide layer of the first type of conductivity, the alpha silicon carbide layer of the second type of conductivity forming the emitter of the transistor;
   C) selectively removing a portion of the alpha silicon carbide layer of the second type of conductivity to expose a portion of the beta silicon carbide layer of the first type of conductivity; and
   D) respectively forming collector, base, and emitter electrodes on the beta silicon carbide substrate of the second type of conductivity, the beta silicon carbide layer of the first type of conductivity and the alpha silicon carbide layer of the second type of conductivity.

2. A method as recited in claim 1, wherein the first type of conductivity is a P type of conductivity and the second type of conductivity is an N type of conductivity.

3. A method as recited in claim 2, wherein the beta silicon carbide layer in Step A is formed by ion implantation.

4. A method as recited in claim 3, wherein boron ions are injected by ion implantation.

5. A method as recited in claim 2, wherein the alpha silicon carbide layer in step B is formed by an RF-CVD method.

6. A method as recited in claim 5, wherein a phosphorus dopant is used in the RF-CVD method.

7. A method as recited in claim 6, wherein the alpha silicon carbide layer is grown to a thickness on the order of 0.2 micrometers using a 1200° C. basic plate temperature and a reaction gas composition of $SiH_4$ (0.15 sccm) and $C_3H_8$ (0.2 sccm).

8. A method as recited in claim 2, wherein the portion of the alpha silicon carbide layer is removed in step C by a plasma etching method.

9. A method as recited in claim 8, wherein plasma etching is effected at an RF power of 200 watts and a pressure of 0.005 Torr and a reaction gas composition of 50% $O_2$ and 50% $CF_4$.

10. A method as recited in claim 1, wherein the beta silicon carbide layer in Step A is formed by ion implantation.

11. A method as recited in claim 1, wherein the alpha silicon carbide layer in step B is formed by an RF-CVD method.

12. A method as recited in claim 1, wherein the portion of the alpha silicon carbide layer is removed in step C by a plasma etching method.

* * * * *